United States Patent [19]

Kohda et al.

[11] Patent Number: 4,779,272

[45] Date of Patent: Oct. 18, 1988

[54] TESTABLE VARIABLE-THRESHOLD NON-VOLATILE SEMICONDUCTOR MEMORY

[75] Inventors: Kenji Kohda; Tsuyoshi Toyama; Nobuaki Ando, all of Hyogo, Japan

[73] Assignee: Mitsubishi Denki Kabushiki Kaisha, Tokyo, Japan

[21] Appl. No.: 923,238

[22] Filed: Oct. 27, 1986

[30] Foreign Application Priority Data

Nov. 13, 1985 [JP] Japan .................................. 60-257096

[51] Int. Cl.$^4$ ............................................ G01R 31/28
[52] U.S. Cl. ......................................... 371/21; 365/201
[58] Field of Search .................. 371/21; 365/184, 185, 365/201; 324/73 R, 73 AT

[56] References Cited

U.S. PATENT DOCUMENTS

| | | | |
|---|---|---|---|
| 4,223,394 | 9/1980 | Pathak | 365/189 X |
| 4,301,535 | 11/1981 | McKenny | 371/21 |
| 4,502,140 | 2/1985 | Proebsting | 371/21 X |
| 4,658,380 | 4/1987 | Eby | 365/201 |
| 4,701,695 | 10/1987 | Chan | 371/21 X |

OTHER PUBLICATIONS

ISSCC 83, Session XIII: "Nonvolative Memory" Van Buskirk, et al., 1983, Santa Clara, CA, pp. 162-163.

*Primary Examiner*—Jerry Smith
*Assistant Examiner*—Robert W. Beausoliel
*Attorney, Agent, or Firm*—Sughrue, Mion, Zinn, Macpeak & Seas

[57] ABSTRACT

A variable-threshold non-volatile memory in which a potential falling between a selection and a non-selection level is applied to the gates and the resultant drain current is measured to determine if one of the transistors has an abnormal threshold voltage.

15 Claims, 2 Drawing Sheets

TESTABLE VARIABLE-THRESHOLD NON-VOLATILE SEMICONDUCTOR MEMORY

BACKGROUND OF THE INVENTION

1. Field of the Invention

The present invention relates to a semiconductor memory, and more particularly to a semiconductor memory, in which electrons are injected into floating gates and are discharged by electrical action or by irradiation of ultraviolet rays. The gates of a plurality of such variable-threshold nonvolatile semiconductor memory transistors are connected to each other in the rows of a matrix and the drains of the transistors are connected to each other in the columns of the matrix.

2. Background Art

FIG. 1 shows an electric circuit diagram of a conventional semiconductor memory. FIG. 2 shows the characteristic relations of a normal memory cell. FIG. 3 shows the characteristic relations of a normal memory cell and a low-threshold memory cell.

The semiconductor memory shown in FIG. 1 is an erasable and electrically-programmable read-only memory (which is hereinafter often referred to as an EPROM) composed of memory cells $Q_{11}$–$Q_{nm}$ of the FAMOS-type. The gates of the memory cells $Q_{11}$–$Q_{nm}$ are connected to each other along the rows of a matrix. Word line signals $WL_1$–$WL_n$ for selecting the rows are applied to the gates of all the cells on that row. The drains of the memory cells $Q_{11}$–$Q_{nm}$ are connected to each other along the columns of the matrix so that the columns are used as bit lines $BL_1$–$BL_m$. Column selection signals $CS_1$–$CS_m$ for selecting the bit lines $BL_1$–$BL_m$ are applied to the bit lines through column selection gates 1–m. The drains of all the column selection gates 1–m are jointly connected to a sense amplifier 20.

The column selection signals $CS_1$–$CS_m$ and the word line signals $WL_1$–$WL_n$ are generated, as shown in FIG. 2, by a column decoder 10 and a row decoder 12 receiving address signals $A_o$–$A_q$. The column decoder 10 selects one of the m column selection signals $CS_1$–$CS_m$ for each unique combination of the p address signals $A_o$–$A_{p-1}$. Similarly, the row decoder 12 selects one of the n word line signals $WL_1$–$WL_n$ for each unique combination of the (q−p+1) address signals $A_p$–$A_q$. Thus, one column and one row is selected for each address signal.

To read information programmed in the EPROM, the word line for the memory cell at a desired address is selected and supplied with an ordinary power voltage of 5 V while all the other word lines are not selected and are supplied with ordinary ground potential of (0 V). Also, only the bit line for the memory cell at the desired address is selected by the column selection signal and is connected to the sense amplifier 20.

FIG. 3 shows the characteristic relations A and B between the gate voltage of the memory cell (the voltage of the word line) and the drain current of the memory cell. When the threshold level of the memory cell in the erased state of "1" is about 1.5 V, the characteristic relation A is obtained. When the threshold level of the memory cell in the programmed state of "0" is about 6 to 10 V, the other characteristic relation B is obtained. A sense current $I_{sense}$ has such a level for the sense amplifier 20 as to detect the drain current of the memory cell $Q_{11}$–$Q_{nm}$ to find out whether the information in the memory cell is "1" or "0". When the word line voltage, which is ordinarily 5 V, is applied to the gate of the memory cell $Q_{11}$–$Q_{nm}$, the memory cell in the erased state shown by the characteristic relation A in FIG. 3 has a drain current $I_M$ larger than a sense current $I_{sense}$, so that the information on the memory cell is judged to be "1". Similarly, the memory cell in the programmed state shown by the characteristic relation B in FIG. 3 has a negligible drain current $I_M$, so that the information on the memory cell is judged to be "0".

Detailed operation of the EPROM is hereafter described with reference to FIG. 1. When the address of the memory cell $Q_{11}$ is selected, the word line signal $WL_1$ is selected, the other word line signals $WL_2$–$WL_n$ are not selected, the column selection signal $CS_1$ is selected and the other column selection signals $CS_2$–$CS_m$ are not selected. As a result, the bit line $BL_1$ is selected and connected to the sense amplifier 20. If the memory cell $Q_{11}$ is the erased state of "1", the memory cell has the characteristic relation A shown in FIG. 3, and since the gate voltage is 5 V, the drain current $I_M$ exceeds the sense current $I_{sense}$. For that reason, the sense amplifier 20 judges the information in the memory cell $Q_{11}$ to be a "1". At that time, whether the other memory cells $Q_{21}$–$Q_{n1}$ on the same bit line $BL_1$ are in the erased state of "1" or in the programmed state "0", their gate voltages are 0 V so that the drain current $I_M$ does not flow through them. For that reason, reading the information on the memory cell $Q_{11}$ is not affected by the other memory cells. If the memory cell $Q_{11}$ is in the programmed state of "0", the memory cell has the characteristic relation B shown in FIG. 3, and its gate voltage is 5 V so that the drain current $I_M$ does not flow, namely, the drain current is smaller than the sense current $I_{sense}$. For that reason, the sense amplifier 20 judges the information on the memory cell $Q_{11}$ to be a "0". At that time, the other memory cells on the same bit line have a negligible drain current $I_M$ for the saem reasons as described above, so that the other memory cells do not affect reading the information on the memory cell $Q_{11}$.

However, in practice the memory cells $Q_{11}$–$Q_{nm}$ actually have irregularities. Although the ordinary threshold voltage of the memory cell in the erased state is about 1.5 V, the threshold voltages of some memory cells are 1 to 2 V higher or lower than the ordinary threshold voltage. Since the erased state of the memory cell with a higher threshold voltage is equivalent to its incompletely programmed state, the memory cell can be easily eliminated as a defective memory by "Erase Check". "Erase Check" means reading the memory cell in the erased state below the power supply voltage of 5 V. In contrast, it is difficult to eliminate a defective memory by erasure if the memory cell has a lower threshold voltage.

Reading the information on the memory cell $Q_{11}$ is hereafter described. Suppose that the memory cell $Q_{11}$ is normal and in the erased state of "1" but that the memory cell $Q_{21}$ is abnormal with the threshold voltage of the memory cell $Q_{21}$ being about −1.5 V. Assume that the other memory cells $Q_{31}$–$Q_{n1}$ on the same bit line are normal and either in the erased state of "1" or in the programmed state of "0". Since the erased memory cell $Q_{11}$ is selected, it has a characteristic relation A shown in FIG. 3 so that when its gate voltage becomes 5 V, its drain current $I_M$ exceeds the sense current $I_{sense}$, and the sense amplifier 20 judges the information in the memory cell $Q_{11}$ to be a "1". At that time, if the unselected memory cell $Q_{21}$ has a characteristic relation C shown in FIG. 4, an electrical current larger than the sense current $I_{sense}$ flows in the memory cell $Q_{21}$ even though an unselected word line voltage of 0 V is applied to it. Although the electrical current is added to the drain current $I_M$ from reading the information on the memory cell $Q_{11}$, it does not affect reading the information of "1" on the memory cell $Q_{11}$, because the sense amplifier 20 judges the information on the memory cell $Q_{11}$ to be "1" if an electrical current equal to or larger than the sense current $I_{sense}$ flows. For the same reason, reading the stored information of "1" from the memory cell $Q_{11}$ is not affected even if the drain current $I_M$ larger than the sensor current $I_{sense}$ flows in each of the other memory cells $Q_{31}$–$Q_{n1}$.

However, suppose that the memory cell $Q_{11}$ is normal and in the programmed state of "0", and the threshold voltage of the other memory cell $Q_{21}$ is about $-1.5$ V. Since the memory cell $Q_{11}$ is selected, it has a characteristic relation B shown in FIG. 4, so that when its gate voltage becomes 5 V, its drain current $I_M$ does not flow. However, the memory cell $Q_{21}$ has the characteristic relation C so that an electrical current larger than the sense current $I_{sense}$ flows even if the gate voltage is 0 V. As a result, the sense amplifier 20 regards the drain current of the memory cell $Q_{21}$ so that of the memory cell $Q_{11}$ so that the same amplifier misjudges the information on the memory cell $Q_{11}$ to be a "1". For that reason, correct reading cannot be performed.

However, programming can be performed into even such depletion-type memory cell. For that reason, when the memory cell $Q_{21}$ is in the programmed state, its threshold voltage is 6 V or more so that the information on the memory cell $Q_{21}$ can be also correctly read without affecting the other memory cells on the same bit line. Even when the memory cell $Q_{21}$ is in the erased state, reading the information on the memory cell $Q_{21}$ is not itself a problem because the drain current of the memory cell $Q_{21}$ is only larger than that of a memory cell in the normal erased state.

When an abnormal memory cell of such kind is to be eliminated in an inspection test, a method described below has been conventionally adopted. In the method, all the memory cells $Q_{11}$–$Q_{nm}$ are first put in the erased state, programming is performed into only one of the memory cells on the bit lines $BL_1$–$BL_m$, and the information on the memory cell in the programmed state is read, so that the other memory cells can be checked. After that, programming is performed into one of the other memory cells on the bit lines, and the information on the memory cell in the programmed state is read, so that the memory cells subjected to the programming and the erasure can be checked. All the memory cells can thus be checked. Although the memory cells can be tested by repeating the programming and the erasure twice, the efficiency of the test is not high, because it is time-consuming to repeat the programming and the erasure.

SUMMARY OF THE INVENTION

Accordingly, it is a primary object of the present invention to provide a semiconductor memory wherein a means is provided on the chip for easily testing each memory cell in the erased state within a short time without repetitive programming and erasure.

In the semiconductor memory provided according to the present inventon, the gates of the plurality of variable-threshold nonvolatile semiconductor memory transistors, in which electrons are injected into floating gates and are discharged by electrical action or by irradiation of ultraviolet rays, are connected to each other in the rows of a matrix, and the drains of the transistors are connected to each other in the columns of the matrix. The semiconductor memory is provided with an ordinary reading mode, in which a memory transistor selected by an address signal is selected by a row decoder and a column decoder, and information programmed in the memory transistor is read through a sense amplifier. The semiconductor memory is also provided with a testing mode, in which a predetermined voltage is applied to the floating gate of a memory transistor. The predetermined voltage is equal to or higher than that of an unselected row in the ordinary reading mode and lower than the normal threshold voltage of the memory transistor having discharged electrons. At least one row is selected by the row decoder, and at least one column is selected by the column decoder, so that an abnormal memory transistor of a threshold voltage lower than the normal threshold voltage of the memory transistor having discharged the electrons through the floating gate is distinguished from the normal memory transistor through a sense amplifier.

DETAILED DESCRIPTION OF THE PREFERRED EMBODIMENTS

In the semiconductor memory provided according to the present invention, in order to select a memory cell of a low threshold voltage, all word lines are simultaneously selected by a prescribed voltage higher than a nonselection voltage and lower than a threshold voltage of about 1.5 V such that a drain current does not flow in a normal memory cell. The bit lines of the memory are sequentially selected so that the sense amplifier can judge whether a drain current flows or not, so as to detect the memory cell of the low threshold voltage.

Since the threshold voltage of the normal memory cell is about 1.5 V, the voltage of each of all the word lines is preset so that the drain current does not flow in the normal memory cell or that at least the drain current is not larger than a sense current $I_{sense}$ even if the drain current does flow because of erroneous threshold voltages. As a result, the sense amplifier judges each of the normal memory cell to be in the state of "0", so that the bit line with the normal memory cells is regarded as normal.

Since a drain current flows in a bit line having an abnormal memory cell and exceeds the sense current, the abnormal memory cell is judged to be in the state of "1", so that the bit line is regarded as abnormal. For that reason, the memory including a memory cell of a low threshold voltage can be easily tested by a built-in circuit provided for the memory so as to perform reading while simultaneously setting one, more or all word lines around a nonselection voltage.

Figure 1:
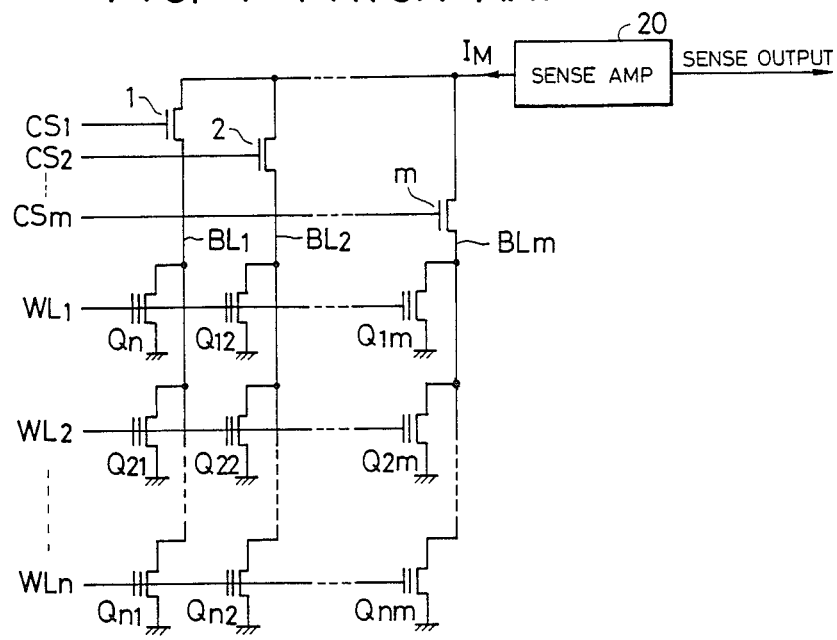
FIG. 1 shows a circuit diagram of a conventional semiconductor memory.
Figure 2:
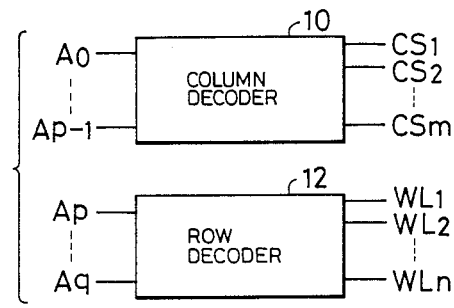
FIG. 2 shows a block diagram of the column and row decoders for the memory of FIG. 1.
Figure 3:
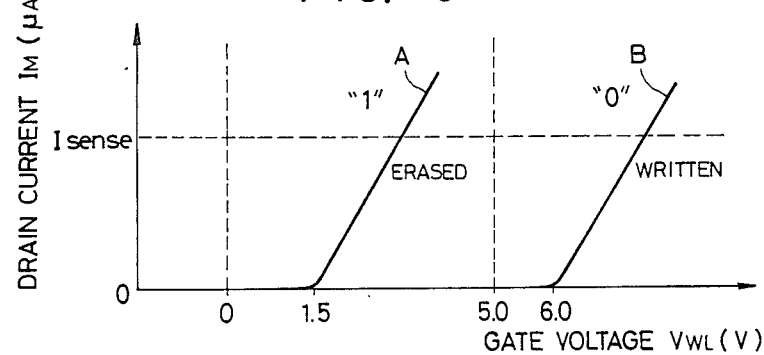
FIG. 3 shows the characteristic relations of a normal memory cell.
Figure 5:
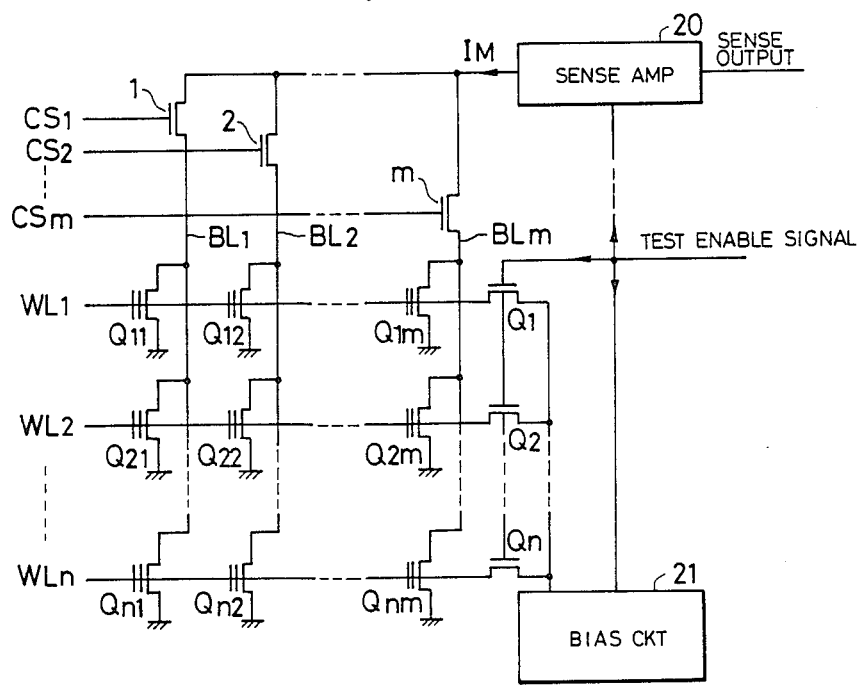
FIG. 5 shows a circuit diagram of an embodiment of the present invention.

FIG. 5 shows a circuit diagram of an embodiment of the present invention. This differs from the circuit diagram of FIG. 1 in the addition of a bias circuit 21, which functions to generate a voltage around a nonselection voltage. Also, transistors $Q_1$-$Q_n$ function to apply the generated bias voltage to all word lines $WL_1$-$WL_n$. A test-enabling signal drives the transistors $Q_1$-$Q_n$.

The operation of the embodiment is hereafter described. In ordinary reading, the test-enabling signal has a voltage of 0 V, and the bias circuit 21 is out of operation. For that reason, the transistors $Q_1$-$Q_n$ are off. As a result, the ordinary reading is performed in a conventional manner.

When the test-enabling signal is put in an active state of 5 V, the bias circuit 21 acts to generate the prescribed voltage. The transistors $Q_1$-$Q_n$ connected to the word lines $WL_1$-$WL_n$ are turned on so that all the word lines are set at the voltage (about 0.5 to 1.0 V) generated by the bias circuit 21. Bit lines $BL_1$-$BL_m$ are then sequentially selected so that reading is performed through a sense amplifier 20 as all memory cells are in the erased state.

Suppose that the bit line $BL_1$ is selected. If the bit cells $Q_{11}$-$Q_{n1}$ are all normal memory cells, namely, their threshold voltages are about 1.5 V, the memory cells have a characteristic relation A shown in FIG. 4, so that a drain current $I_M$ does not flow even if a gate voltage of about 0.5 to 1.0 V is applied. As a result, since the drain current $I_M$ is smaller than a sense current $I_{sense}$, the sense amplifier 20 judges the memory cells to be in the state of "0" or be normal.

Figure 4:
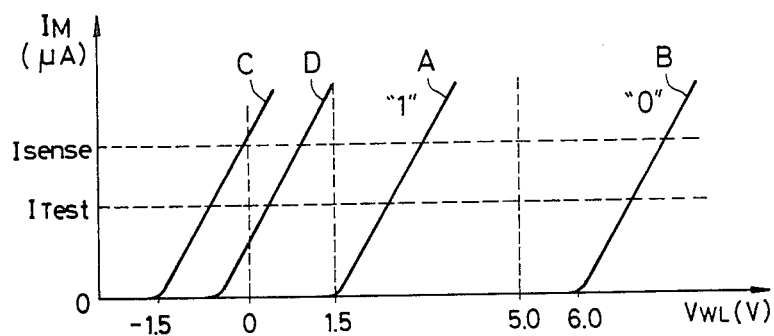
FIG. 4 shows the characteristic relations of a normal memory cell and a memory cell of a low threshold voltage.

However, the memory cell $Q_{11}$ has an abnormal characteristic relation C or D shown in FIG. 4, namely, the threshold voltage of the memory cell is negative, the drain current in the bit line $BL_1$ becomes larger than the sense current $I_{sense}$ in the sense amplifier 20 because the memory cell $Q_{11}$ is on, so that the memory cell is judged to be in the state of "1" or be abnormal.

Even if the threshold voltage is not negative, the same effect is produced when a plurality of memory cells whose threshold voltages are not higher than 0 to 1.5 V are on the same bit line. For instance, 1,024 memory cells are connected in the same bit line of a 512K EPROM, so that correct reading through the bit line cannot be performed when the sum of the electrical currents of several to scores of the memory cells is larger than the sense current $I_{sense}$, even if the current of each memory cell is small.

When the test-enabling signal is made active in order to conduct a test with a margin, the sensitivity of the sense amplifier 20 may be increased. At that time, the sensitivity is altered so that distinguishing between "1" and "0" is performed by a test current $I_{test}$ instead of the ordinary sense current $I_{sense}$ for distinguishment between "1" and "0". A more accurate test can thus be conducted.

According to the present invention, a circuit for performing reading while simultaneously setting one, several or all word lines around a nonselection voltage is built in to provide a testing mode, as described above, so that a memory, which has a memory cell of a low threshold voltage can be easily tested in the erased state thereof conventionally, an equally effective test requires the time-consuming repetition of programming and erasure.

What is claimed is:

1. A semiconductor memory, comprising:
   a plurality of variable-threshold nonvolatile semiconductor memory transistors arranged in rows and columns, each said memory transistor comprising a source, a drain, and a gate, said gate being a floating gate injectable with electrons and being dischargeable, wherein gates of all transistors in any of said rows are connected to a corresponding word line, drains of all transistors in any of said columns are connected to a corresponding bit line, one of said word lines being selected by a row selection signal being at a first potential, the remaining word lines being non-selected by row selection signals being at a second potential;
   a plurality of column selection transistors each having a source connected to a respective one of said bit lines and a gate connected to a respective one of a plurality of column selection lines carrying column selection signals;
   a row decoder and a column decoder receiving address signals for selecting one of said plurality of memory transistors and providing respectively said row selection signals and column selection signals;
   a sense amplifier having an input connected to drains of all said column selection transistors and providing a sense output for reading said selected one of said memory transistors; and
   means for selectively applying a third potential to the gates of all of said memory transistors in at least one of said rows, said third potential being between said first potential and said second potential, wherein said sense amplifier detects whether, when said third potential is applied, a drain current flowing through a respective one of said bit lines exceeds a sense current corresponding to said sense output.

2. A semiconductor memory as recited in claim 1, wherein said applying means selectively applies said third potential to the gates of all of said memory transistors in all of said rows.

3. A semiconductor memory as recited in claim 1, wherein during selective operation of said applying means the floating gates of all said memory transistors contain injected electrons and are not discharged.

4. A semiconductor memory as recited in claim 1, wherein said third potential is greater than said second potential by less than a normal threshold voltage of said memory transistors.

5. A semiconductor memory device as recited in claim 1, wherein if said first potential is $V_1$, said second potential is $V_2$ and said third potential is $V_3$, then $$V_3 = V_2 + A(V_1 - V_2)$$

wherein A is in the range of 0.1 to 0.2.

6. A semiconductor memory as recited in claim 5, wherein said applying means selectively applies said third potential to the gates of all of said memory transistors in all of said rows.

7. A semiconductor memory as recited in claim 1, wherein said sense amplifier detects whether said drain current exceeds a test current, less than said sense current.

8. A method of testing an array of variable-threshold nonvolatile semiconductor memory transistors, arranged in rows and columns, a drain of each said memory transistor being connected to a bit line associated with a row, a floating gate of each said memory transistor being connected to a word line associated with a column and being selectable by a selection signal at a first potential and being nonselectable by a selection signal at a second potential, said floating gate being injectable with electrons and being dischargeable, said method comprising the steps of:

applying a testing signal at a third potential between said first and second potentials to at least one of said word lines; and sensing a drain current, caused by said applying step, into at least one of said bit lines to detect whether said drain current exceeds a sense circuit output by a sense amplifier having a drain connected to a plurality of column selection transistors.

9. A testing method as recited in claim 8, wherein said applying step simultaneously applies said testing signal to all of said word lines.

10. A testing method as recited in claim 8, further comprising the step of injecting electrons into floating gates of all said memory transistors and wherein said applying step is performed after said injecting step before said floating gates are discharged.

11. A testing method as recited in claim 8, wherein said third potential is larger than said second potential by no more than a threshold voltage of said memory transistors.

12. A testing method as recited in claim 8, wherein if said first potential is $V_1$, said second potential is $V_2$ and said third potential is $V_3$, then $$V_3 = V_2 + A(V_1 - V_2)$$

wherein A is in the range of 0.1 to 0.2.

13. A testing method as recited in claim 8, further comprising;

applying a first reading signal at said first potential to only one of said word lines;

applying a second reading signal at said second potential to the gate of only one selection transistor; and sensing a current into all of said selection transistors.

14. A testing method as recited in claim 8, further comprising the step of judging said array of transistors to be abnormal if said sensed current is larger than a predetermined level.

15. A testing method as recited in claim 8, wherein said sensing step detects whether said drain current exceeds a test current, less than said sense current.

* * * * *